United States Patent
Cheng et al.

(10) Patent No.: US 12,048,204 B2
(45) Date of Patent: Jul. 23, 2024

(54) DISPLAY PANEL, MANUFACTURING METHOD THEREOF AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Tianyi Cheng, Beijing (CN); Chi Yu, Beijing (CN); Xingliang Xiao, Beijing (CN); Zhong Lu, Beijing (CN); Benlian Wang, Beijing (CN); Yuanzheng Guo, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 578 days.

(21) Appl. No.: 17/286,860

(22) PCT Filed: Jan. 22, 2020

(86) PCT No.: PCT/CN2020/073904
§ 371 (c)(1),
(2) Date: Apr. 20, 2021

(87) PCT Pub. No.: WO2021/147033
PCT Pub. Date: Jul. 29, 2021

(65) Prior Publication Data
US 2022/0310729 A1    Sep. 29, 2022

(51) Int. Cl.
*H10K 59/124* (2023.01)
*H10K 59/122* (2023.01)
*H10K 71/00* (2023.01)

(52) U.S. Cl.
CPC ......... *H10K 59/124* (2023.02); *H10K 59/122* (2023.02); *H10K 71/00* (2023.02)

(58) Field of Classification Search
CPC .... H10K 59/124; H10K 59/122; H10K 71/00; H10K 59/121; H10K 77/111;
(Continued)

(56) References Cited

U.S. PATENT DOCUMENTS 10,084,000 B2    9/2018    Tian
10,991,848 B2    4/2021    Ma et al.
(Continued)

FOREIGN PATENT DOCUMENTS

CN    102496617 A    6/2012
CN    108807671 A    11/2018
(Continued)

OTHER PUBLICATIONS

International Search Report of PCT/CN2020/073904 in Chinese, mailed Sep. 27, 2020 with English translation.
(Continued)

*Primary Examiner* — Mohammad A Rahman
(74) *Attorney, Agent, or Firm* — Collard & Roe, P.C.

(57) ABSTRACT

A display panel, a manufacturing method thereof and a display device are provided. The display panel includes a base substrate, the base substrate includes a display region and a peripheral region surrounding the display region, the base substrate includes a first substrate layer, a third substrate layer and a second substrate layer which are sequentially stacked, a material of the second substrate layer includes amorphous silicon. The display region includes a transparent display region, the transparent display region includes a pixel region and a light transmission region, and a thickness of the second substrate layer located in the light transmission region is less than a thickness of at least part of the second substrate layer located outside the transparent display region.

19 Claims, 6 Drawing Sheets

(58) Field of Classification Search
CPC ........ H10K 59/65; H10K 59/00; H10K 99/00;
H10K 59/10; H10K 59/12; H10K
59/1213; H10K 59/123; H10K 59/125;
H10K 59/127; H10K 59/1275; H10K
59/805; H04M 1/0266
See application file for complete search history.

(56) References Cited

U.S. PATENT DOCUMENTS

| | | |
|---|---|---|
| 2008/0213949 A1 | 9/2008 | Tung |
| 2014/0084291 A1 | 3/2014 | Ye et al. |
| 2015/0277017 A1* | 10/2015 | Aoyagi ............... F21V 9/08 156/60 |
| 2016/0233289 A1* | 8/2016 | Son ..................... H10K 50/80 |
| 2018/0040648 A1 | 2/2018 | Tian |
| 2019/0189731 A1* | 6/2019 | Managaki ............ G06F 3/0443 |
| 2020/0220092 A1 | 7/2020 | Liu et al. |
| 2021/0336225 A1* | 10/2021 | Ke ....................... H10K 50/858 |
| 2022/0013594 A1* | 1/2022 | Wang ................... H10K 59/121 |

FOREIGN PATENT DOCUMENTS

| | | |
|---|---|---|
| CN | 109994047 A | 7/2019 |
| CN | 110518037 A | 11/2019 |
| IN | 105206569 A | 12/2015 |

OTHER PUBLICATIONS

Notice of Transmittal of the International Search Report of PCT/CN2020/073904 in Chinese, mailed Sep. 27, 2020.
Written Opinion of the International Searching Authority of PCT/CN2020/073904 in Chinese, mailed Sep. 27, 2020.
Extended European Search Report in European Patent Application No. 20878038.7 dated Jan. 4, 2023.
Written Opinion of the International Searching Authority of PCT/CN2020/073904, mailed Sep. 27, 2020 in English.

* cited by examiner

DISPLAY PANEL, MANUFACTURING METHOD THEREOF AND DISPLAY DEVICE

CROSS REFERENCE TO RELATED APPLICATIONS

This application is the National Stage of PCT/CN2020/073904 filed on Jan. 22, 2020, the disclosure of which is incorporated by reference.

TECHNICAL FIELD

At least one embodiment of the present disclosure relates to a display panel, a manufacturing method thereof and a display device.

BACKGROUND

The concept of full-screen mobile phone using organic light emitting diodes has been attracted wide attention in the mobile phone market, and it is also the development trend in the future. In the full-screen mobile phone, a functional component, such as a camera, etc., can be hidden, so that the front visible area is almost all the screen, and therefore, the user can get a better display effect.

SUMMARY

At least an embodiment of the present disclosure provides a display panel, a manufacturing method thereof and a display device.

At least an embodiment of the present disclosure provides a display panel, including: a base substrate, including a display region and a peripheral region surrounding the display region, the base substrate including a first substrate layer, a third substrate layer and a second substrate layer which are sequentially stacked, a material of the second substrate layer including amorphous silicon. The display region includes a transparent display region, the transparent display region includes a pixel region and a light transmission region, and a thickness of the second substrate layer located in the light transmission region is less than a thickness of at least part of the second substrate layer located outside the transparent display region.

In some examples, the display panel includes: a plurality of pixel units, located in the display region of the base substrate. The display region includes a first pixel density region and a second pixel density region, a pixel density of the pixel units located in the first pixel density region is greater than a pixel density of the pixel units located in the second pixel density region, and the transparent display region is located in the second pixel density region.

In some examples, each of the plurality of pixel units includes an organic light emitting layer, and a first electrode and a second electrode which are located at both sides of the organic light emitting layer. The display panel includes a thin film transistor, and the thin film transistor is located at one side of the third substrate layer away from the second substrate layer, the second electrode is connected with the thin film transistor, and the second electrode of the pixel unit located in the transparent display region is located in the pixel region.

In some examples, the second substrate layer located in the transparent display region includes a first pattern, and an orthographic projection of the first pattern on the first substrate layer coincides with an orthographic projection of the second electrode on the first substrate layer.

In some examples, the second substrate layer located in the transparent display region further includes an opening, and the opening is located in the light transmission region.

In some examples, a thickness of the first pattern is the same as the thickness of the at least part of the second substrate layer located outside the transparent display region.

In some examples, the second pixel density region further includes a transition region located at a periphery of the transparent display region, the second substrate layer located in the transition region includes a second pattern, and an orthographic projection of the second pattern on the first substrate layer coincides with the orthographic projection of the second electrode on the first substrate layer.

In some examples, the transparent display region is not provided with the second substrate layer.

In some examples, a thickness of the second substrate layer located at each position in the transparent display region is even, and a thickness of the second substrate layer located in the transparent display region is less than the thickness of the at least part of the second substrate layer located outside the transparent display region.

In some examples, a thickness of the second substrate layer located outside the transparent display region is even.

In some examples, a thickness of the second substrate layer located at each position in the display region is even, and a thickness of the second substrate layer located in the peripheral region is greater than a thickness of the second substrate layer located in the display region.

In some examples, the thickness of the second substrate layer located in the transparent display region is in a range from 1 nanometer to 3 nanometers.

In some examples, the display region is not provided with the second substrate layer.

In some examples, a material of the first substrate layer includes polyimide, and a material of the third substrate layer includes silicon oxide or silicon nitride.

In some examples, the base substrate further includes a fourth substrate layer located at one side of the second substrate layer away from the third substrate layer, and a material of the fourth substrate layer includes polyimide.

An embodiment of the present disclosure provides a display panel, including: a base substrate, including a display region and a peripheral region surrounding the display region, the base substrate including a first substrate layer, a second substrate layer and a third substrate layer which are sequentially stacked, a material of the second substrate layer including amorphous silicon. A thickness of the second substrate layer at each position in the display region and the peripheral region is even and not more than 10 nanometers.

In some examples, the thickness of the second substrate layer is in a range from 1 nanometer to 3 nanometers.

In some examples, display panel further includes: a plurality of pixel units, located in the display region of the base substrate, wherein the display region includes a first pixel density region and a second pixel density region, a pixel density of the pixel units located in the first pixel density region is greater than a pixel density of the pixel units located in the second pixel density region, and a transparent display region is located in the second pixel density region.

In some examples, each of the plurality of pixel units includes an organic light emitting layer, and a first electrode and a second electrode which are located at both sides of the organic light emitting layer, the display panel includes a thin film transistor, and the thin film transistor is located at one side of the third substrate layer away from the second substrate layer.

An embodiment of the present disclosure provides a manufacturing method of the display panel as mentioned above, including: forming the first substrate layer; forming the third substrate layer on the first substrate layer; forming a second substrate material layer on one side of the third substrate layer away from the first substrate layer; and patterning the second substrate material layer located in the transparent display region by using a mask plate to form the first pattern, wherein the mask plate is a mask plate for forming the second electrode in the transparent display region.

An embodiment of the present disclosure provides a display device, including: the display panel as mentioned above; and a functional component, located in the transparent display region and at a side opposite to a light emitting side of the display panel, the functional component being configured to emit or receive light passing through the transparent display region.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. Also, the terms "comprise," "comprising," "comprise," "comprising," etc., are intended to specify that the elements or the objects stated before these terms encompass the elements or the objects and equivalents thereof listed after these terms, but do not preclude the other elements or objects.

The base substrate of an organic light emitting diode display panel includes a multi-layer structure. For example, the multi-layer structure can include an organic layer, an amorphous silicon layer and an inorganic layer which are sequentially stacked. The camera is located at a side opposite to a light emitting side of the organic light emitting diode display panel, that is, the organic light emitting diode display panel includes an organic light emitting element, and the camera is located at one side of the base substrate away from the organic light emitting element. Therefore, the ambient light passes through the base substrate and then enters the camera arranged in the mobile phone.

Figure 1:
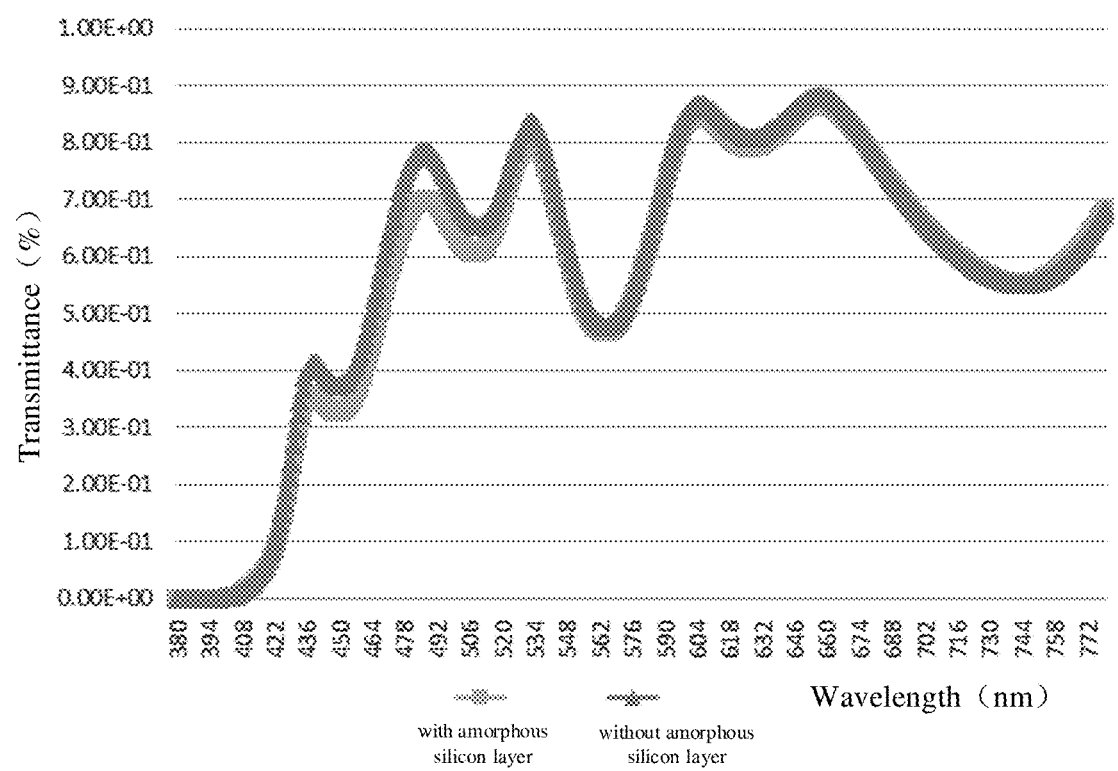
FIG. 1 is a schematic diagram showing the influence of an amorphous silicon layer in a base substrate on light transmittance.

FIG. 1 is a schematic diagram showing the influence of an amorphous silicon layer in a base substrate on light transmittance. As shown in FIG. 1, compared with the case where the amorphous silicon layer is included in the base substrate, the transmittance of blue light is significantly improved after the amorphous silicon layer in the base substrate is removed. In the schematic diagram shown in FIG. 1, the abscissa is wavelength, and the ordinate is transmittance. The transmittance of blue light within the wavelength range from 478 nm to 492 nm can be increased by about 10%, while the overall transmittance of the base substrate in the visible band can be increased by about 2% to 4%. In research, the inventors of the present application have observed that: in the case where the amorphous silicon layer of the organic light emitting diode display panel is thick, for example, the thickness thereof is greater than 15 nanometers, the amorphous silicon layer with larger thickness will weaken the blue light in the external ambient light incident thereon, which results in that the light received by the camera is uneven, and further in that the light received by the camera is yellowish.

The embodiments of the present disclosure provide a display panel, a manufacturing method thereof, and a display device. The display panel includes a base substrate, and the base substrate includes a display region and a peripheral region surrounding the display region. The base substrate includes a first substrate layer, a third substrate layer and a second substrate layer which are sequentially stacked, and the material of the second substrate layer includes amorphous silicon. The display region includes a transparent display region, the transparent display region includes a pixel region and a light transmission region, and a thickness of the second substrate layer located in the light transmission region is less than a thickness of at least part of the second substrate layer located outside the transparent display region. In the embodiment of the present disclosure, the transmittance of blue light passing through the transparent display region can be improved by setting the thickness of the second substrate layer at the position of the light transmission region to be less than the thickness of the second substrate layer outside the transparent display region.

Hereinafter, the display panel, the manufacturing method thereof and the display device provided by the embodiments of the present disclosure will be described with reference to the accompanying drawings.

Figure 2:
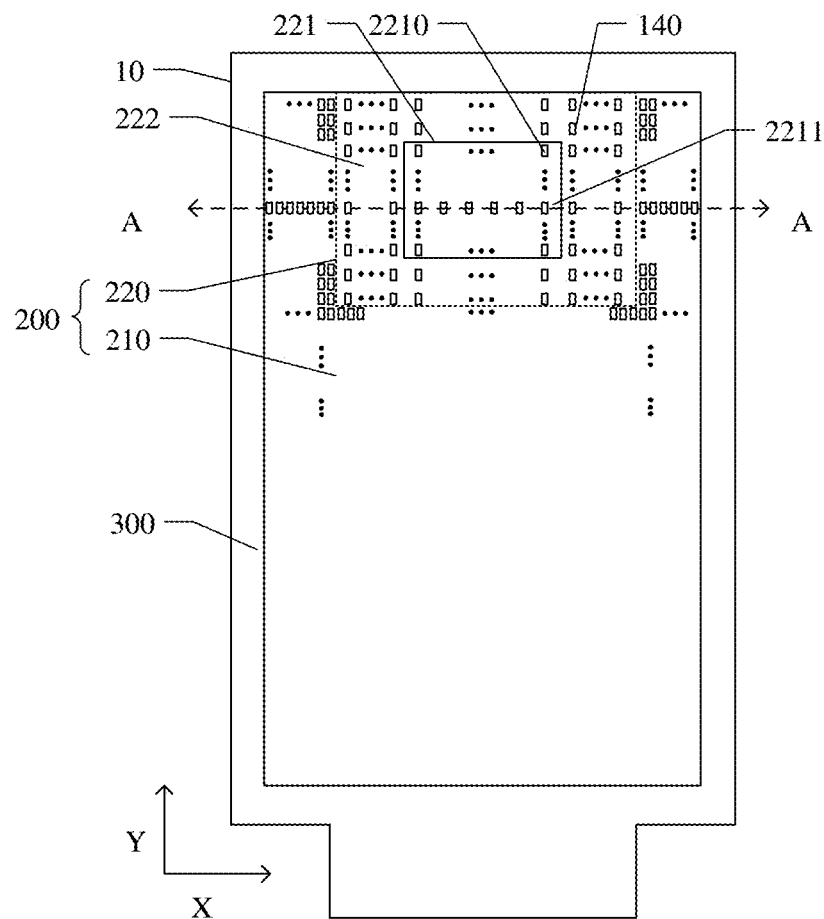
FIG. 2 is a partial planar structural view of a display panel according to an embodiment of the present disclosure.
Figure 3A:
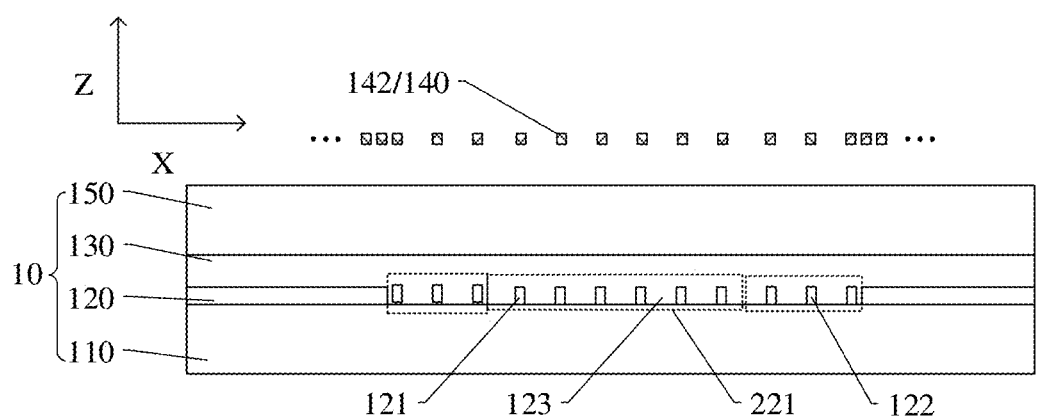
FIG. 3A is a partial cross-sectional structural view taken along line AA shown in FIG. 2 in an example of an embodiment of the present disclosure.

FIG. 2 is a partial planar structural view of a display panel according to an embodiment of the present disclosure, and FIG. 3A is a partial cross-sectional structural view taken along line AA shown in FIG. 2 in an example of an embodiment of the present disclosure. As shown in FIG. 2, the display panel includes a base substrate 10, and the base substrate 10 includes a display region 200 and a peripheral region 300 surrounding the display region 200. For example, the display region 200 is a region for displaying a picture, that is, a light emitting region; and the peripheral region 300 is a region not for displaying a picture, that is, a non-light emitting region.

As shown in FIG. 3A, the base substrate 10 includes a first substrate layer 110, a second substrate layer 120 and a third substrate layer 130 which are sequentially stacked, and the material of the second substrate layer 120 includes amorphous silicon. As shown in FIG. 2 and FIG. 3A, the display region 200 includes a transparent display region 221, the transparent display region 221 includes a pixel region 2210 and a light transmission region 2211, and a thickness of the second substrate layer 120 located in the light transmission region 2211 is less than a thickness of at least part of the second substrate layer 120 located outside the transparent display region 221. In the embodiment of the present disclosure, the transmittance of blue light in the second substrate layer located in the light transmission region can be improved by setting the thickness of the second substrate layer located in the light transmission region to be less than the thickness of the second substrate layer located outside the transparent display region. It should be noted that the thickness of the second substrate layer located in the light transmission region can be zero. That is, the second substrate layer may not be disposed in the light transmission region. For example, the thickness of the second substrate layer in the whole transparent display region is less than the thickness of the second substrate layer outside the transparent display region, or the second substrate layer in the transparent display region is patterned to make the second substrate layer in the light transmission region thinner (including thinned to zero).

Figure 3B:
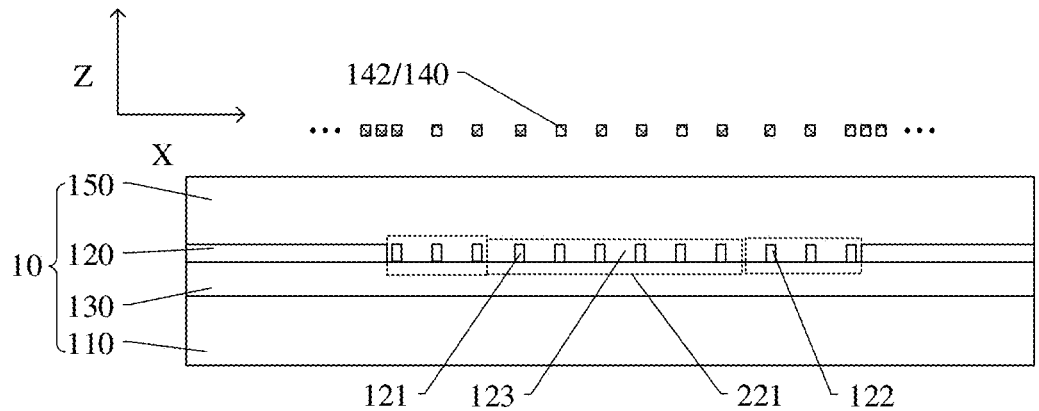
FIG. 3B is a partial cross-sectional structural view taken along line AA shown in FIG. 2 in another example of an embodiment of the present disclosure.

FIG. 3B is a partial cross-sectional structural view taken along line AA shown in FIG. 2 in another example of an embodiment of the present disclosure. The example shown in FIG. 3B is different from the example shown in FIG. 3A in that: in the example shown in FIG. 3A, the second substrate layer 120 is located between the first substrate layer 110 and the third substrate layer 130; and in the example shown in FIG. 3B, the second substrate layer 120 is located at one side of the third substrate layer 130 away from the first substrate layer 110. The following embodiments are described by taking that the second substrate layer 120 is located at one side of the third substrate layer 130 away from the first substrate layer 110 as an example.

For example, as shown in FIG. 1, the display panel further includes a plurality of pixel units 140 located in the display region 200 of the base substrate 10. The display region 200 includes a first pixel density region 210 and a second pixel density region 220, and the pixel density (Pixels Per Inch, PPI) of the plurality of pixel units 140 located in the first pixel density region 210 is greater than the pixel density of the plurality of pixel units 140 located in the second pixel density region 220, that is, the first pixel density region 210 can be a high pixel density region and the second pixel density region 220 can be a low pixel density region. The transparent display region 221 is located in the second pixel density region 220, that is, the transparent display region 221 is a part of the low pixel density region.

For example, the first pixel density region 210 can also be referred to as a normal pixel region, the second pixel density region 220 can also be referred to as an abnormal pixel region, the light emitting area of pixel units in the second pixel density region 220 can be ¼ of the light emitting area of pixel units in the first pixel density region 210, and the PPI of pixel units in the second pixel density region 220 can be ½ of the PPI of pixel units in the first pixel density region 210.

In the case where the camera is located at the non-display side of the display panel, the camera performs imaging by acquiring external light signals passing through the transparent display region. In the embodiment of the disclosure, the PPI of the transparent display region is designed to be lower than the PPI of the first pixel density region, so that the light transmittance of the transparent display region can be increased while taking account of display, so as to realize the photographing function.

For example, as shown in FIG. 2, the area of the first pixel density region 210 is larger than the area of the second pixel density region 220, so as to realize normal display.

For example, as shown in FIG. 2, the combined shape of the first pixel density region 210 and the second pixel density region 220 can be rectangular, that is, the shape of the display region 200 can be rectangular. For example, the shape of the display region 200 can be a regular shape, such as a rectangle or a circle, etc., or an irregular shape. For example, the shape of the second pixel density region 220 can be a regular shape, such as a rectangle or a circle, etc., or an irregular shape. For example, the shape of the transparent display region 221 can be a regular shape, such as a rectangle or a circle, etc., or an irregular shape, which is not limited in the embodiments of the present disclosure.

For example, the first pixel density region 210 can surround the second pixel density region 220, or the second pixel density region 220 can also be located at one side edge of the first pixel density region 210. The embodiment of the present disclosure does not limit the positional relationship between the first pixel density region and the second pixel density region.

Figure 4A:
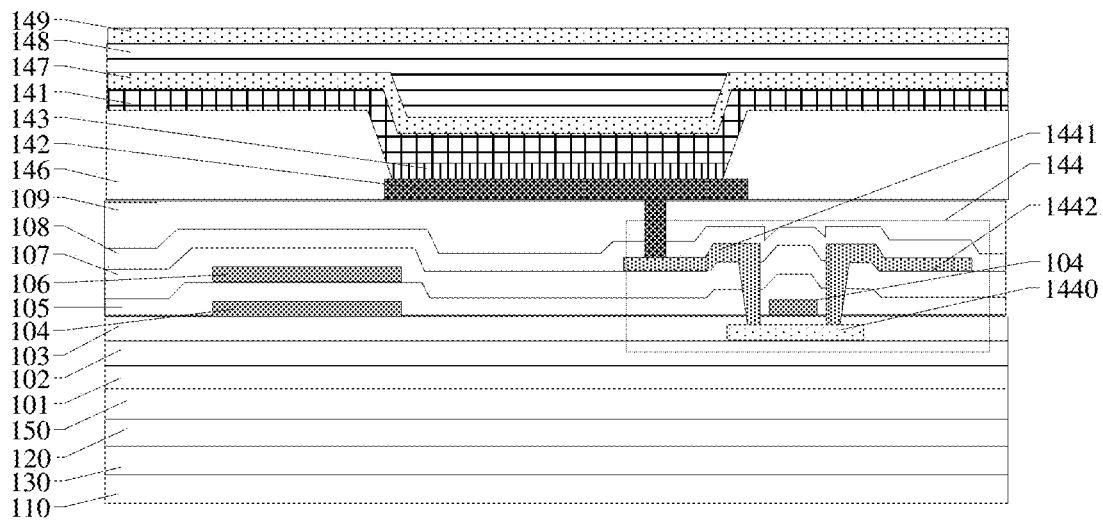
FIG. 4A is a partial cross-sectional structural view of a pixel unit outside a transparent display region in a display panel according to an embodiment of the present disclosure.

FIG. 4A is a partial cross-sectional structural view of a pixel unit outside a transparent display region in a display panel according to an embodiment of the present disclosure. As shown in FIG. 1 and FIG. 4A, each pixel unit 140 located outside the transparent display region 221 can include a plurality of sub-pixels, and each sub-pixel includes an organic light emitting element and a pixel circuit electrically connected with the organic light emitting element. The organic light emitting element includes an organic light emitting layer 143, and a first electrode 141 and a second electrode 142 which are located at both sides of the organic light emitting layer 143. And the organic light emitting layer 143 can be driven to emit light by applying an electrical signal to the first electrode 141 and the second electrode 142.

For example, the embodiment of the present disclosure takes that the second electrode 142 is an independent electrode of each sub-pixel, and the first electrode 141 is a common electrode shared by respective sub-pixels as an example, but is not limited thereto.

For example, the pixel unit 140 can include sub-pixels of different colors, such as a red sub-pixel, a green sub-pixel and a blue sub-pixel, which are not limited in the embodiment of the present disclosure and can be set according to actual product demands.

For example, as shown in FIG. 4A, the display panel includes a pixel defining layer 146, and the pixel defining layer 146 includes a plurality of openings to define light emitting regions of the sub-pixels.

For example, as shown in FIG. 4A, each pixel unit 140 further includes a thin film transistor 144 electrically connected with the second electrode 142, and the thin film transistor 144 is located at one side of the second substrate layer 120 away from the third substrate layer 130. FIG. 4A illustratively shows that the second substrate layer 120 is a patterned structure (including a first pattern 121), which is not limited thereto. And the second substrate layer 120 can also be an integral layer or a film layer only located outside the transparent display region.

For example, as shown in FIG. 4A, the thin film transistor 144 includes an active layer 1440, and the material of the active layer 1440 includes amorphous silicon. The thin film transistor 144 further includes a source electrode 1441 and a drain electrode 1442, and one of the source electrode 1441 and the drain electrode 1442 is electrically connected with the second electrode 142.

For example, as shown in FIG. 4A, the second electrode 142 is electrically connected with one of the source electrode 1441 and the drain electrode 1442 through a via hole in the passivation layer 108 and the planarization layer 109 which are between the second electrode 142 and the source/drain electrode.

FIG. 4A only illustratively shows a thin film transistor electrically connected with the second electrode, and the thin film transistor can be a light emitting control transistor in a pixel circuit included in the display panel. For example, the pixel circuit in the embodiment of the present disclosure can include a 7T1C (i.e., seven transistors and one capacitor) structure, but is not limited thereto, and the pixel circuit can also include a 7T2C structure, a 6T1C structure, a 6T2C structure, or a 9T2C structure, etc.

For example, in the case where the pixel circuit includes a 7T1C structure, the pixel circuit can include a driving transistor T1, a data writing transistor T2, a threshold compensation transistor T3, a first light emitting control transistor T4, a second light emitting control transistor T5, a first reset transistor T6 and a second reset transistor T7. The thin film transistor shown in FIG. 4A can be the second light emitting control transistor electrically connected with the driving transistor and the second electrode of the organic light emitting element, and configured to turn on or off the connection between the driving transistor and the organic light emitting element; a control end of the driving transistor is connected with a data line included in the display panel, and a first end or a second end of the driving transistor is electrically connected with the second electrode of the organic light emitting element, so as to provide a driving current for driving the organic light emitting element to emit light. The pixel unit shown in FIG. 4A includes a pixel circuit, but the pixel unit located in the transparent display region differs from the pixel unit shown in FIG. 4A in that the pixel unit in the transparent display region does not include a pixel circuit.

For example, as shown in FIG. 2, a region outside the transparent display region 221 includes the first pixel density region 210 and a region of the second pixel density region 220 other than the transparent display region 221. For example, the second pixel density region 220 further includes a transition region 222 located at the periphery of the transparent display region 221. The embodiment of the present disclosure takes that the region of the second pixel density region 220 other than the transparent display region 221 is the transition region 222 as an example, but is not limited thereto, and the second pixel density region can further include other regions.

For example, the pixel units 140 located in the transition region 222 and the pixel units 140 located in the first pixel density region 210 include an organic light emitting element and a pixel circuit, and the PPI of the pixel units 140 located in the transition region 222 is lower than the PPI of the pixel units located in the first pixel density region 220.

For example, the pixel unit 140 located in the transparent display region 221 only includes an organic light emitting element, and does not include a pixel circuit. For example, each pixel unit 140 located in the transparent display region 221 includes an organic light emitting layer 143, a first electrode 141, and a second electrode 142. For example, the second electrode 142 included in the organic light emitting element is only located in the pixel region 2210, but not in the light transmission region 2211. Only the organic light emitting element is disposed in the pixel region 2210, and no pixel circuit is disposed in the pixel region 2210. For example, the pixel unit located in the transparent display region only includes an organic light emitting element, thus better ensuring the light transmittance at the position of the camera and achieving a better photographing effect.

For example, the pixel circuit electrically connected with the organic light emitting element in the transparent display region 221 is not disposed in the transparent display region 221, but is disposed in a region outside the transparent display region 221, for example, in the transition region 222. For example, the wire connected with the organic light emitting element in the transparent display region 221 can be made of a transparent conductive material, so as to ensure the transmission of signals and have a relatively high light transmittance.

For example, as shown in FIGS. 2-3B, the second substrate layer 120 located in the transparent display region 221 includes a first pattern 121, and the orthographic projection of the first pattern 121 on the first substrate layer 110 coincides with the orthographic projection of the second electrode 142 on the first substrate layer 110, that is, the first pattern 121 is located in the pixel region 2210. That is to say, the second substrate layer 120 can be patterned with the same mask plate as the second electrode 142 in the organic light emitting element, so as to save the mask plate process. For example, the first substrate layer 110 and the third substrate layer 130 in the embodiment of the present disclosure are continuous integral layers so that the base substrate is a continuous layer. The coincidence of the orthographic projections of the first pattern and the second electrode on the first substrate layer can include a complete coincidence or approximate coincidence of the orthographic projections, and the approximate coincidence of the orthographic projections of the first pattern and the second electrode means that the coincidence rate of the orthographic projections is greater than 95%.

For example, as shown in FIG. 4A, the display panel further includes a first buffer layer 101, a second buffer layer 102, and a first gate insulating layer 103 sequentially located on the fourth substrate layer 150. The first gate insulating layer 103 covers the active layer 1440, a first gate layer 104 is disposed on the first gate insulating layer 103, a second gate insulating layer 105 is disposed on the first gate layer 104, a second gate layer 106 is disposed on the second gate insulating layer 105, an interlayer insulating layer 107 is disposed on the second gate layer 106, the source and drain electrodes 1441 and 1442 are disposed on the interlayer insulating layer 107, and the source and drain electrodes 1441 and 1442 are electrically connected with the active layer 1440 through via holes in the interlayer insulating layer 107 and the second gate insulating layer 105. A first inorganic encapsulation layer 147, an organic encapsulation layer 148 and a second inorganic encapsulation layer 149 are sequentially arranged at one side of the first electrode 141 away from the first substrate layer 110.

Figure 4B:
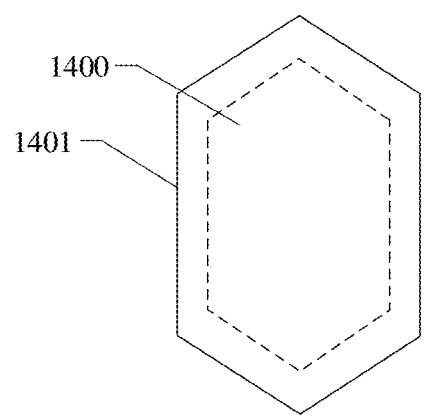
FIG. 4B is a schematic diagram of a light emitting region of one pixel in a pixel unit located in a second pixel density region according to an embodiment of the present disclosure.
Figure 4C:
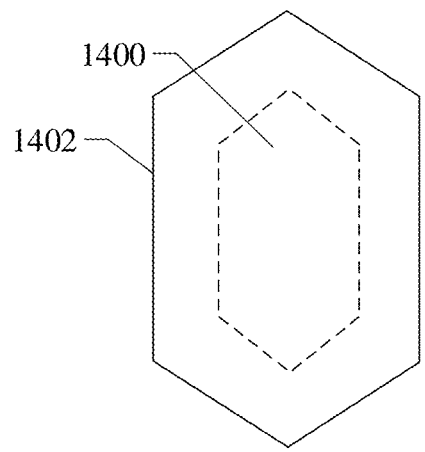
FIG. 4C is a schematic diagram of a light emitting region of one pixel in a pixel unit located in a first pixel density region according to an embodiment of the present disclosure.

For example, FIG. 4B is a schematic diagram of a light emitting region of one pixel in a pixel unit located in a second pixel density region according to an embodiment of the present disclosure; and FIG. 4C is a schematic diagram of a light emitting region of one pixel in a pixel unit located in a first pixel density region according to an embodiment of the present disclosure. As shown in FIG. 4B and FIG. 4C, the area of the light emitting region 1400 of the sub-pixel 1401 included in the pixel unit in the second pixel density region is greater than the area of the light emitting region 1400 of the sub-pixel 1402 included in the pixel unit in the first pixel density region.

For example, the area of the opening of the pixel defining layer in the first pixel density region can be set less than the area of the opening of the pixel defining layer in the second pixel density region, so that the light emitting region of the sub-pixel 1401 in the second pixel density region has a larger area than the light emitting region of the sub-pixel in the first pixel density region.

For example, the area of the second electrode of the sub-pixel in the first pixel density region can be set less than the area of the second electrode of the sub-pixel in the second pixel density region, so that the area of the light emitting region of the sub-pixel in the second pixel density region is greater than the area of the light emitting region of the sub-pixel in the first pixel density region. In this case, compared with the case where the area of the second electrode of the sub-pixel in the first pixel density region is equal to the area of the second electrode of the sub-pixel in the second pixel density region, the area of the first pattern of the second substrate layer becomes larger, and the area of the opening located in the light transmission region correspondingly decreases.

Figure 5:
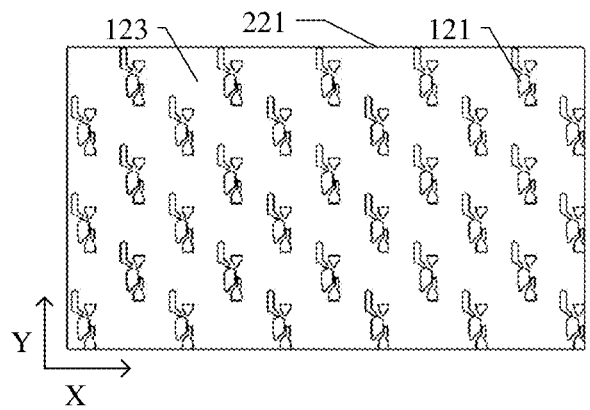
FIG. 5 is a schematic plan view of a second substrate layer in a transparent display region of a display panel shown in FIG. 3B.

FIG. 5 is a schematic plan view of a second substrate layer in a transparent display region of a display panel shown in FIG. 3B. As shown in FIGS. 2-5, the sub-pixels included in the pixel units are arranged in a GGRB pixel arrangement structure as an example, that is, one pixel group includes two green sub-pixels, one red sub-pixel and one blue sub-pixel. The four second electrodes included in the four sub-pixels in the same pixel group are separated from each other, and there is a certain spacing between adjacent pixel groups. The embodiments of the present disclosure is not limited thereto, and the plurality of sub-pixels included in the display panel can be arranged in various pixel arrangements.

For example, as shown in FIGS. 2-4A, the second substrate layer 120 located in the transparent display region 221 further includes an opening 123, and the orthographic projection of the opening 123 on the first substrate layer 110 is not overlapped with the orthographic projection of the second electrode 142 on the first substrate layer 110, that is, the opening 123 is located in the light transmission region 2211. That is to say, the second substrate layer 120 located in the transparent display region 221 can include a first pattern 121 and an opening 123, the first pattern 121 is located in the pixel region, and the opening 123 is located in the light transmission region. For example, the orthographic projection of the opening 123 on the first substrate layer 110 can coincide with the orthographic projection of the spacing between the second electrodes 142 on the first substrate layer 110. For example, the planar shapes of the first pattern 121 and the opening 123 can be complementary shapes.

In an embodiment of the present disclosure, the second substrate layer located in the transparent display region includes a first pattern and an opening, so the second substrate layer located in the transparent display region can include two different thicknesses, namely, the thickness at the position of the first pattern and the thickness at the position of the opening. The thickness of the second substrate layer at the position of the opening is 0, so the thickness of the second substrate layer at the position of the opening is less than the thickness of at least part of the second substrate layer outside the transparent display region.

For example, as shown in FIGS. 2-4A, the thickness of the first pattern 121 can be the same as the thickness of at least part of the second substrate layer 120 located outside the transparent display region 221. For example, the thickness of the second substrate layer 120 located outside the transparent display region 221 can be the same as the thickness of the amorphous silicon layer included in the base substrate of a common display panel, which is, for example, greater than 15 nanometers, and the thickness of the first pattern 121 is the same as the thickness of the second substrate layer 120 located outside the transparent display region 221, so as to save a mask plate. The embodiment of the present disclosure is not limited thereto, and the thickness of the first pattern can also be less than the thickness of at least part of the second substrate layer located outside the transparent display region, thereby further improving the transmittance of blue light in the transparent display region.

In the embodiment of the present disclosure, the transmittance of blue light passing through the base substrate in the transparent display region can be improved by patterning the second substrate layer in the transparent display region to form an opening.

For example, as shown in FIGS. 1-4A, the second substrate layer 120 located in the transition region 222 includes a second pattern 122, and the orthographic projection of the second pattern 122 on the first substrate layer 110 coincides with the orthographic projection of the second electrode 142 on the first substrate layer 110.

For example, the second substrate layer 120 located in the transition region 222 further includes an opening pattern (not labeled), and the orthographic projection of the opening pattern on the first substrate layer 110 is not overlapped with the orthographic projection of the second electrode 142 on the first substrate layer 110.

For example, the first pattern 121 can include a plurality of first sub-patterns, and each first sub-pattern can be the same as the pattern of the second electrode included in each pixel group located in the transparent display region 221. The second pattern 122 can also include a plurality of second sub-patterns, and each second sub-pattern can be the same as the pattern of the second electrode included in each pixel unit located in the transition region 222.

For example, the planar shape of the first sub-pattern is the same as the planar shape of the second sub-pattern, and the size of the first sub-pattern is the same as the size of the second sub-pattern.

For example, the first pattern 121 and the second pattern 122 can be patterns formed by patterning in the same process with using the same mask plate.

The PPI of pixel units located in the second pixel density region is even, so the PPI of pixel units located in the transparent display region and the PPI of pixel units located in the transition region are equal. Therefore, a mask region for patterning to form the second electrode in the transparent display region and a mask region for patterning to form the second electrode in the transition region are two regions of the same mask plate. That is, one mask plate is used to simultaneously form the second electrodes of the organic light emitting elements located in the transparent display region and the transition region, and the mask region for forming the second electrode of the transparent display region is a part of the mask plate. While patterning to form the first pattern of the second electrode in the transparent display region by using a mask plate, the second pattern can be formed, so as to save the process.

For example, the material of the first substrate layer 110 can include an organic material, such as polyimide, etc., and the material of the third substrate layer 130 can include an inorganic material, such as silicon oxide or silicon nitride, etc.

For example, as shown in FIG. 3B, the base substrate 10 further includes a fourth substrate layer 150 located at one side of the second substrate layer 120 away from the third substrate layer 130, and the material of the fourth substrate layer 150 includes polyimide. In the embodiment of the present disclosure, the interface adhesion effect between the fourth substrate layer and the third substrate layer can be improved by arranging the second substrate layer made of amorphous silicon between the fourth substrate layer and the third substrate layer.

For example, the thickness of the fourth substrate layer 150 is in a micron level, and the thickness of the second substrate layer 120 is in a nanometer level, for example, not more than 10 nanometers. Therefore, even if the second substrate layer 120 located in the transparent display region 221 is patterned to form an opening 123, the side of the base substrate 10 facing the organic light emitting element will not be uneven.

For example, the thin film transistor 144 can be located at one side of the fourth substrate layer 150 away from the second substrate layer 120.

Figure 6:
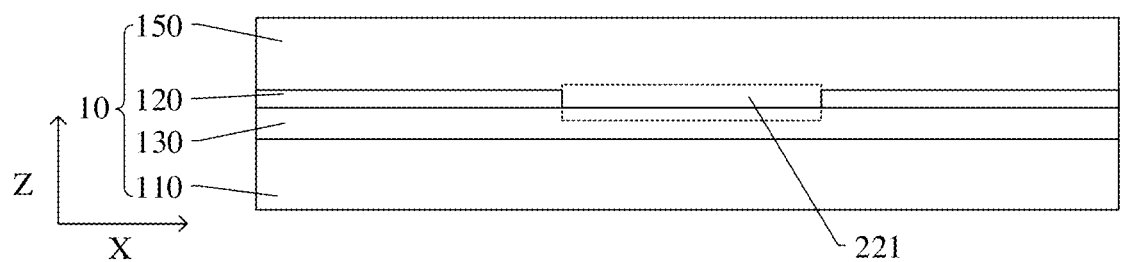
FIG. 6 is a partial cross-sectional structural view of a display panel according to another embodiment of the present disclosure.

For example, FIG. 6 is a partial cross-sectional structural view of a display panel according to another embodiment of the present disclosure. FIG. 6 can be a partial cross-sectional structural view taken along line AA shown in FIG. 2. As shown in FIG. 6, the present embodiment differs from the embodiment shown in FIG. 3B in that: the second substrate layer 120 is not disposed in the transparent display region 221 in the present embodiment, that is, the thickness of the second substrate layer 120 in the transparent display region 221 is 0.

In the embodiment of the present disclosure, by removing the second substrate layer of the base substrate in the transparent display region, that is, a second substrate layer is not disposed in the transparent display region, the transmittance of blue light in the transparent display region can be increased, and the purpose of improving the photographing effect of the camera can be achieved.

For example, as shown in FIG. 2 and FIG. 6, in the display region 200, the thickness of the second substrate layer 120 located at each position other than the transparent display region 221 is even to ensure a good adhesion effect between the fourth substrate layer 150 and the third substrate layer 130.

For example, as shown in FIG. 2 and FIG. 6, the thickness of the second substrate layer 120 located outside the transparent display region 221 is even to ensure a good adhesion effect between the fourth substrate layer 150 and the third substrate layer 130. That is, the thickness of the second substrate layer 120 located in the display region 200 other than the transparent display region 221 and the thickness of the second substrate layer 120 located in the peripheral region 300 are equal to facilitate manufacturing.

For example, as shown in FIG. 2 and FIG. 6, the thickness of the second substrate layer 120 located outside the transparent display region 221 can be greater than 15 microns.

For example, the thickness of the second substrate layer in the peripheral region can be greater than the thickness of the second substrate layer in the display region.

The characteristics, such as material, shape and thickness, etc., of the first substrate layer 110, the third substrate layer 130 and the fourth substrate layer 150 included in the base substrate in the embodiment shown in FIG. 6 are the same as those of the three film layers included in the embodiment shown in FIG. 3B, and details will not be repeated here.

The characteristics, such as structure, arrangement, and positional relationship with the transparent display region, of the pixel unit in the embodiment shown in FIG. 6 are the same as those of the pixel unit in the embodiment shown in FIG. 3B, and details will not be repeated here.

Figure 7:
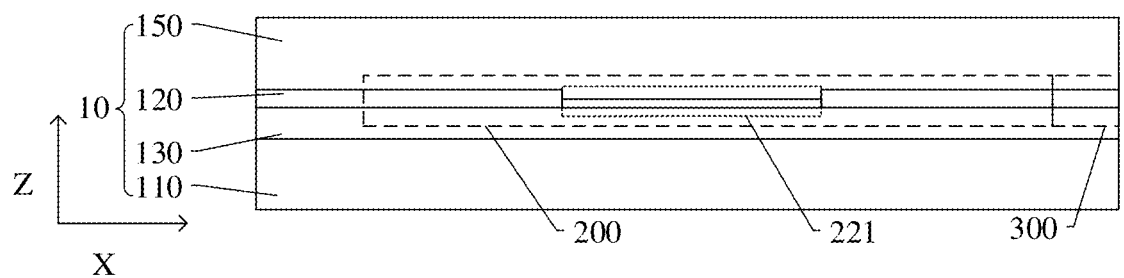
FIG. 7 is a partial cross-sectional structural view of a display panel according to another embodiment of the present disclosure.

For example, FIG. 7 is a partial cross-sectional structural view of a display panel according to another embodiment of the present disclosure. FIG. 7 can be a partial cross-sectional structural view taken along line AA shown in FIG. 2. As shown in FIG. 7, the present embodiment differs from the embodiment shown in FIG. 3B in that: in the present embodiment, the thickness of the second substrate layer 120 located at each position in the transparent display region 221 is even, and the thickness of the second substrate layer 120 in the transparent display region 221 is less than the thickness of at least part of the second substrate layer 120 located outside the transparent display region 221.

For example, the thickness of the second substrate layer 120 located in the transparent display region 221 is in the range from 1 nm to 3 nm, and the thickness of at least part of the second substrate layer 120 located outside the transparent display region 221 is greater than 15 nm.

For example, the thickness of the second substrate layer 120 located in the transparent display region 221 is in the range from 1.5 nm to 2.5 nm.

In the embodiment of the present disclosure, by thinning the thickness of the second substrate layer of the base substrate in the transparent display region, the transmittance of blue light in the transparent display region can be increased, and the purpose of improving the photographing effect of the camera can be achieved.

For example, as shown in FIG. 7, in the display region 200, the thickness of the second substrate layer 120 located at each position other than the transparent display region 221 is even to ensure a good adhesion effect between the fourth substrate layer 150 and the third substrate layer 130.

For example, as shown in FIG. 7, the thickness of the second substrate layer 120 located outside the transparent display region 221 is even to ensure a good adhesion effect between the fourth substrate layer 150 and the third substrate layer 130. That is, the thickness of the second substrate layer 120 located in the display region 200 other than the transparent display region 221 and the thickness of the second substrate layer 120 located in the peripheral region 300 are equal to facilitate manufacturing.

For example, the thickness of the second substrate layer in the peripheral region can be greater than the thickness of the second substrate layer in the display region.

The characteristics, such as material, shape and thickness, etc., of the first substrate layer 110, the third substrate layer 130 and the fourth substrate layer 150 included in the base substrate in the embodiment shown in FIG. 7 are the same as those of the three film layers included in the embodiment shown in FIG. 3B, and details will not be repeated here.

The characteristics, such as structure, arrangement, and positional relationship with the transparent display region, of the pixel unit in the embodiment shown in FIG. 7 are the same as those of the pixel unit in the embodiment shown in FIG. 3B, and details will not be repeated here.

Figure 8:
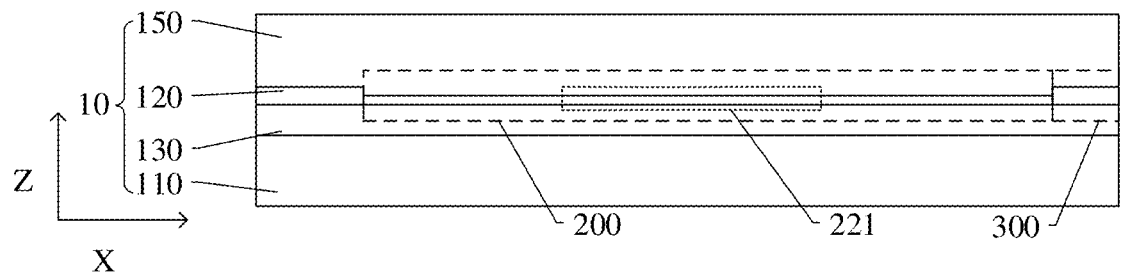
FIG. 8 is a partial cross-sectional structural view of a display panel according to another embodiment of the present disclosure.

For example, FIG. 8 is a partial cross-sectional structural view of a display panel according to another embodiment of the present disclosure. FIG. 8 can be a partial cross-sectional structural view taken along line AA shown in FIG. 2. As shown in FIG. 8, the present embodiment differs from the embodiment shown in FIG. 3B in that: in the present embodiment, the thickness of the second substrate layer 120 located at each position in the display region 200 is even, and the thickness of the second substrate layer 120 in the peripheral region 300 is greater than the thickness of the second substrate layer 120 in the display region 200.

For example, the thickness of the second substrate layer 120 in the display region 200 is in the range from 1 nm to 3 nm, and the thickness of the second substrate layer 120 in the peripheral region 300 is greater than 15 nm.

For example, the thickness of the second substrate layer 120 in the display region 200 is in the range from 1.5 nm to 2.5 nm.

In the embodiment of the present disclosure, by thinning the thickness of the second substrate layer of the base substrate in the display region, the transmittance of blue light in the transparent display region can be increased, and the purpose of improving the photographing effect of the camera can be achieved.

For example, as shown in FIG. 8, the thickness of the second substrate layer 120 in the peripheral region 300 is even to ensure a good adhesion effect between the fourth substrate layer 150 and the third substrate layer 130.

The characteristics, such as material, shape and thickness, etc., of the first substrate layer 110, the third substrate layer 130 and the fourth substrate layer 150 included in the base substrate in the embodiment shown in FIG. 8 are the same as those of the three film layers included in the embodiment shown in FIG. 3B, and details will not be repeated here.

The characteristics, such as structure, arrangement, and positional relationship with the transparent display region, of the pixel unit in the embodiment shown in FIG. 8 are the same as those of the pixel unit in the embodiment shown in FIG. 3B, and details will not be repeated here.

Figure 9:
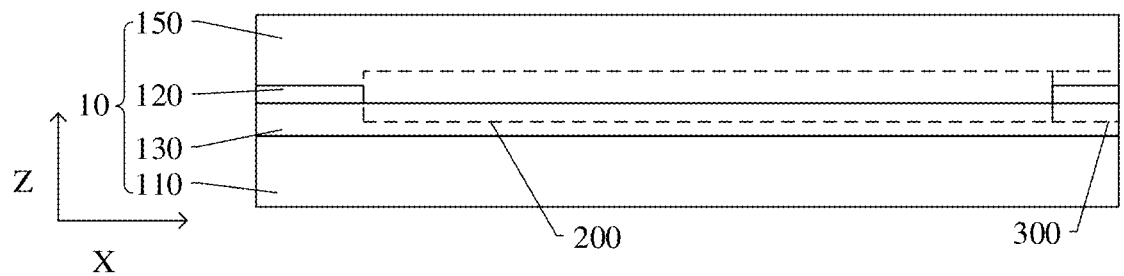
FIG. 9 is a partial cross-sectional structural view of a display panel according to another embodiment of the present disclosure.

For example, FIG. 9 is a partial cross-sectional structural view of a display panel according to another embodiment of the present disclosure. FIG. 9 can be a partial cross-sectional structural view taken along line AA shown in FIG. 2. As shown in FIG. 9, the present embodiment differs from the embodiment shown in FIG. 3B in that: the second substrate layer 120 is not disposed in the display region 200 in the present embodiment, that is, the thickness of the second substrate layer 120 in the display region 200 is 0.

In the embodiment of the present disclosure, by removing the second substrate layer of the base substrate in the display region, the transmittance of blue light in the transparent display region can be increased, and the purpose of improving the photographing effect of the camera can be achieved.

For example, as shown in FIG. 2 and FIG. 9, the thickness of the second substrate layer 120 located in the peripheral region 300 is even to ensure a good adhesion effect between the fourth substrate layer 150 and the third substrate layer 130.

For example, the thickness of the second substrate layer 120 located in the peripheral region 300 can be greater than 15 nanometers.

The characteristics, such as material, shape and thickness, etc., of the first substrate layer 110, the third substrate layer 130 and the fourth substrate layer 150 included in the base substrate in the embodiment shown in FIG. 9 are the same as those of the three film layers included in the embodiment shown in FIG. 3B, and details will not be repeated here.

The characteristics, such as structure, arrangement, and positional relationship with the transparent display region, of the pixel unit in the embodiment shown in FIG. 9 are the same as those of the pixel unit in the embodiment shown in FIG. 3B, and details will not be repeated here.

The transparent display region in the embodiments shown in FIGS. 6-9 can be located in the second pixel density region 220 (i.e., a low pixel density region) shown in FIG. 2, or can be located in the first pixel density region 210 (i.e., a high pixel density region) shown in FIG. 2. The embodiments of the present disclosure takes that the transparent display region in the embodiments shown in FIGS. 6-9 is located in the second pixel density region 220 shown in FIG. 2 as an example, so that the light transmittance of the transparent display region can be increased while taking account of display, so as to realize the photographing function.

Figure 10:
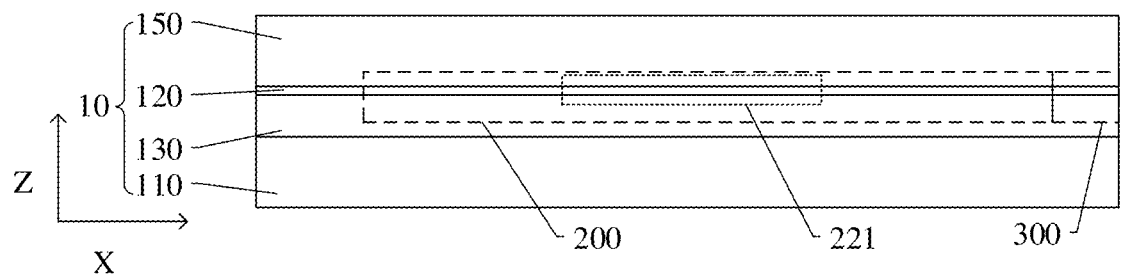
FIG. 10 is a partial cross-sectional structural view of a display panel according to another embodiment of the present disclosure.

For example, FIG. 10 is a partial cross-sectional structural view of a display panel according to another embodiment of the present disclosure. FIG. 10 is also a partial cross-sectional structural view taken along line AA shown in FIG. 2. As shown in FIG. 2 and FIG. 10, the display panel includes a base substrate 10, and the base substrate 10 includes a display region 200 and a peripheral region 300 surrounding the display region 200.

As shown in FIG. 2 and FIG. 10, the base substrate 10 includes a first substrate layer 110, a third substrate layer 130 and a second substrate layer 120 which are sequentially stacked, and the material of the second substrate layer 120 includes amorphous silicon. The thickness of the second substrate layer 120 located at each position in the display region 200 and the peripheral region 300 is even and not more than 10 nanometers. In the embodiment of the present disclosure, the transmittance of blue light in the transparent display region can be improved by setting the thickness of the second substrate layer in the base substrate to be relatively small.

For example, the thickness of the second substrate layer 120 can be in the range from 1 nm to 3 nm.

For example, the thickness of the second substrate layer 120 can be in the range from 1.5 nm to 2.5 nm.

Compared with the case where the thickness of the second substrate layer in a common base substrate is greater than 15 nm, the thickness of the second substrate layer in the embodiment of the present disclosure is not greater than 10 nm, and by setting the thickness of the second substrate layer in the base substrate to be relatively small, the transmittance of blue light in the transparent display region can be improved.

In the embodiment of the present disclosure, a second substrate layer with a thinner thickness, such as 1-3 nm, can be directly formed by deposition, without being patterned, thus improving the transmittance of blue light in the transparent display region without increasing the process cost.

For example, as shown in FIG. 2 and FIG. 10, the display panel further includes a plurality of pixel units 140 located in the display region 200 of the base substrate 10. The display region 200 includes a first pixel density region 210 and a second pixel density region 220, and the pixel density (Pixels Per Inch, PPI) of the plurality of pixel units 140 located in the first pixel density region 210 is greater than the pixel density of the plurality of pixel units 140 located in the second pixel density region 220, that is, the first pixel density region 210 can be a high pixel density region and the second pixel density region 220 can be a low pixel density region. The transparent display region 221 is located in the second pixel density region 220, that is, the transparent display region 221 is a part of the low pixel density region.

In the case where the camera is located at the non-display side of the display panel, the camera performs imaging by acquiring external light signals passing through the transparent display region. In the embodiment of the disclosure, the PPI of the transparent display region is designed to be lower than the PPI of the first pixel density region, so that the light transmittance of the transparent display region can be increased while taking account of display, so as to realize the photographing function.

For example, as shown in FIG. 2, the combined shape of the first pixel density region 210 and the second pixel density region 220 can be rectangular, that is, the shape of the display region 200 can be rectangular. For example, the shape of the display region 200 can be a regular shape, such as a rectangle or a circle, etc., or an irregular shape. For example, the shape of the second pixel density region 220 can be a regular shape, such as a rectangle or a circle, etc., or an irregular shape. For example, the shape of the transparent display region 221 can be a regular shape, such as a rectangle or a circle, etc., or an irregular shape, which is not limited in the embodiments of the present disclosure.

For example, the first pixel density region 210 can surround the second pixel density region 220, or the second pixel density region 220 can also be located at one side edge of the first pixel density region 210. The embodiment of the present disclosure does not limit the positional relationship between the first pixel density region and the second pixel density region.

For example, as shown in FIG. 2, a region outside the transparent display region 221 include the first pixel density region 210 and a region of the second pixel density region 220 other than the transparent display region 221. For example, the second pixel density region 220 further includes a transition region 222 located at the periphery of the transparent display region 221. The embodiment of the present disclosure takes that the region of the second pixel density region 220 other than the transparent display region 221 is the transition region 222 as an example, but is not limited thereto, and the second pixel density region can further include other regions.

The pixel unit included in the embodiment of the present disclosure can have the same characteristics as the pixel unit shown in FIG. 4A, and details will not be repeated here.

For example, another embodiment of the present disclosure provides a manufacturing method of the display panel shown in FIG. 3B. As shown in FIG. 3B, the manufacturing method provided by the embodiment of the present disclosure includes:

S10: forming the first substrate layer 110.

For example, the material of the first substrate layer 110 can include an organic material, such as polyimide, etc.

For example, the first substrate layer 110 can be a continuous integral layer.

S20: forming the third substrate layer 130 on the first substrate layer 110.

For example, the third substrate layer 130 can be a continuous integral layer.

For example, the material of the third substrate layer 130 can include an inorganic material, such as silicon oxide or silicon nitride, etc.

S30: forming a second substrate material layer on one side of the third substrate layer 130 away from the first substrate layer 110.

For example, the material of the second substrate material layer includes amorphous silicon.

S40: patterning the second substrate material layer located in the transparent display region 221 by using a mask plate to form the first pattern 121, wherein the mask plate is a mask plate for forming the second electrode 142 in the transparent display region 221.

For example, after the second substrate material layer is formed on the third substrate layer, the second substrate material layer can be etched by means of dry etching or wet etching. Because the material of the first substrate layer is an organic material and the material of the second substrate layer is an inorganic material, in the case of wet etching, the inorganic material can be selectively etched by selecting appropriate etching solution, and the influence on the organic material is low. For example, the etching solution has an obvious etching selection between the second substrate material layer and the first substrate layer, so as to prevent the etching solution from etching the first substrate layer.

For example, the first pattern 121 is formed by etching the second substrate material layer in the transparent display region 221 using the mask plate for forming the second electrode 142 in the transparent display region 221 as a mask, thus improving the transmittance of blue light in the transparent display region while ensuring that no additional mask plate is needed.

For example, as shown in FIG. 3B, while forming the first pattern 121, the second substrate material layer located in the transition region 222 can be patterned to form the second pattern 122 by using the above mask plate.

The PPI of pixel units located in the second pixel density region is even, so the PPI of pixel units located in the transparent display region and the PPI of pixel units located in the transition region are equal. Therefore, a mask region used to form the second electrode in the transparent display region by patterning and a mask region used to form the second electrode in the transition region by patterning are two regions of the same mask plate. That is, a mask plate is used simultaneously to form the second electrodes of the organic light emitting elements located in the transparent display region and the transition region, and the mask region for forming the second electrode in the transparent display region is a part of the mask plate. While patterning to form the first pattern by using a mask plate for forming the second electrode in the transparent display region, the second pattern can be formed, so as to save the process.

For example, as shown in FIG. 3B, after forming the first pattern 121 and the second pattern 122, the fourth substrate layer 150 is formed on one side of the second substrate layer 120 away from the third substrate layer 110.

For example, the material of the fourth substrate layer 150 can be an organic material, such as polyimide, etc. In the embodiment of the present disclosure, by arranging the second substrate layer made of amorphous silicon between the fourth substrate layer and the third substrate layer, the interface adhesion effect between the fourth substrate layer and the third substrate layer can be improved.

For example, the fourth substrate layer 150 can be a continuous integral layer.

For example, the fourth substrate layer 150 can be formed by coating.

For example, the thickness of the fourth substrate layer 150 is in a micron level, and the thickness of the second substrate layer 120 is in a nanometer level, for example, not more than 10 nanometers. Therefore, even if the second substrate layer 120 located in the transparent display region 221 is patterned to form an opening 123, the side of the base substrate 10 facing the organic light emitting element will not be uneven.

Figure 11:
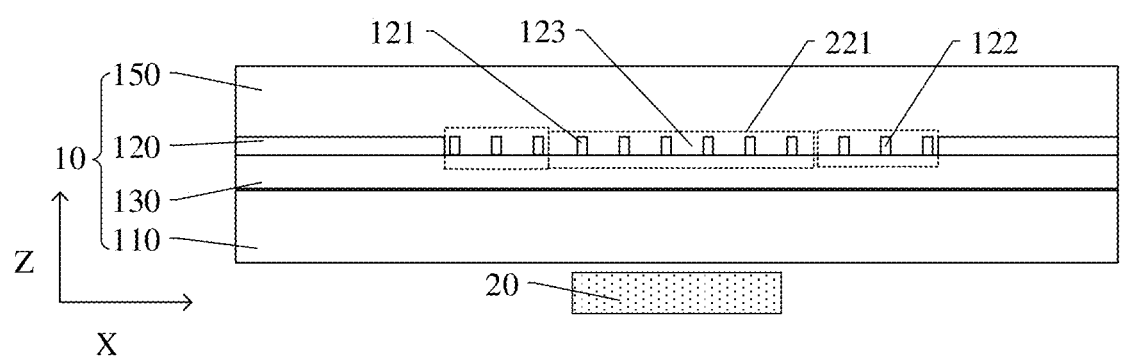
FIG. 11 is a partial cross-sectional structural view of a display device according to another embodiment of the present disclosure.

For example, FIG. 11 is a partial cross-sectional structural view of a display device according to another embodiment of the present disclosure. As shown in FIG. 11, the display device provided by the embodiment of the present disclosure includes any one of the above display panels. FIG. 11 illustratively shows that the display device includes the display panel shown in FIG. 3B, which is not limited thereto, and the display device can also include the display panel shown in any one of the embodiments as shown in FIG. 3A and FIGS. 6-10. As shown in FIG. 11, the display device includes a functional component 20 located in the transparent display region 221 and at a side opposite to a light emitting side of the display panel, and the functional component 20 is configured to emit or receive light passing through the transparent display region. For example, ambient light can be incident on the functional component 20 through the transparent display region 221. In the embodiment of the present disclosure, the transmittance of blue light in the transparent display region can be improved by setting the thickness of at least part of the second substrate layer in the transparent display region to be less than the thickness of the second substrate layer outside the transparent display region, so that the functional component can receive more blue light to improve performance.

For example, the functional component 20 is located at one side of the base substrate 10 away from the organic light emitting element.

For example, the orthographic projection of the functional component 20 on the base substrate 10 is not overlapped with the transition region 222 and the first pixel density region 210.

For example, the functional component 20 includes at least one selected from the group consisting of a camera module (e.g., a front camera module), a 3D structured light module (e.g., a 3D structured light sensor), a time-of-flight 3D imaging module (e.g., a time-of-flight sensor), and an infrared sensing module (e.g., an infrared sensor), etc.

In the case where the functional component includes a camera, by adjusting the thickness or shape of the second substrate layer located in the transparent display region, the color cast can be reduced and the photographing effect of the camera can be improved.

For example, the front camera module is usually enabled when the user takes a selfie or makes a video call, and the pixel display region of the display device displays the self-taken image for the user to watch. The front camera module includes, for example, a lens, an image sensor, and an image processing chip, etc. The optical image of the scene generated by the lens is projected onto the surface of the image sensor (the image sensor includes CCD and CMOS) and converted into electrical signals, and the electrical signals are converted into digital image signals after analog-to-digital conversion by the image processing chip, and then, the digital image signals are sent to a processor for processing, and the image of the scene is output on the display screen.

For example, the 3D structured light sensor and the time-of-flight (ToF) sensor can be used for face recognition to unlock display device, etc.

For example, the functional component 20 may only include a camera module to realize the function of selfie or video call; and for example, the functional component 20 may further include a 3D structured light module or a time-of-flight 3D imaging module to realize face recognition unlocking, etc. The present embodiment includes but is not limited thereto.

The following statements should be noted:

(1) In the accompanying drawings of the embodiments of the present disclosure, the drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto, and the protection scope of the present disclosure should be based on the protection scope of the claims.

What is claimed is:

1. A display panel, comprising:
a base substrate comprising a display region and a peripheral region surrounding the display region, the base substrate comprising a first substrate layer, a third substrate layer and a second substrate layer which are sequentially stacked, a material of the second substrate layer comprising amorphous silicon,
wherein the display region comprises a transparent display region, the transparent display region comprises a pixel region and a light transmission region, and a thickness of the second substrate layer located in the light transmission region is less than a thickness of at least part of the second substrate layer located outside the transparent display region;
the display panel further comprising: a plurality of pixel units located in the display region of the base substrate, wherein the display region comprises a first pixel density region and a second pixel density region, a pixel density of the plurality of pixel units located in the first pixel density region is greater than a pixel density of the plurality of pixel units located in the second pixel density region, and the transparent display region is located in the second pixel density region.

2. The display panel according to claim 1, wherein each of the plurality of pixel units comprises an organic light emitting layer, and a first electrode and a second electrode which are located at both sides of the organic light emitting layer,
the display panel comprises a thin film transistor, and the thin film transistor is located at one side of the third substrate layer away from the first substrate layer, wherein the second electrode is connected with the thin film transistor, and the second electrode of the pixel unit located in the transparent display region is located in the pixel region.

3. The display panel according to claim 2, wherein the second substrate layer located in the transparent display region comprises a first pattern, and an orthographic projection of the first pattern on the first substrate layer coincides with an orthographic projection of the second electrode on the first substrate layer.

4. The display panel according to claim 3, wherein the second substrate layer located in the transparent display region further comprises an opening, and the opening is located in the light transmission region.

5. The display panel according to claim 3, wherein a thickness of the first pattern is the same as the thickness of the at least part of the second substrate layer located outside the transparent display region.

6. The display panel according to claim 3, wherein the second pixel density region further comprises a transition region located at a periphery of the transparent display region, the second substrate layer located in the transition region comprises a second pattern, and an orthographic projection of the second pattern on the first substrate layer coincides with the orthographic projection of the second electrode on the first substrate layer.

7. The display panel according to claim 1, wherein the transparent display region is not provided with the second substrate layer.

8. The display panel according to claim 1, wherein a thickness of the second substrate layer located at each position in the transparent display region is even, and a thickness of the second substrate layer located in the transparent display region is less than the thickness of the at least part of the second substrate layer located outside the transparent display region.

9. The display panel according to claim 7, wherein a thickness of the second substrate layer located outside the transparent display region is even.

10. The display panel according to claim 1, wherein a thickness of the second substrate layer located at each position in the display region is even, and a thickness of the second substrate layer located in the peripheral region is greater than a thickness of the second substrate layer located in the display region.

11. The display panel according to claim 8, wherein the thickness of the second substrate layer located in the transparent display region is in a range from 1 nanometer to 3 nanometers.

12. The display panel according to claim 1, wherein the display region is not provided with the second substrate layer.

13. The display panel according to claim 1, wherein a material of the first substrate layer comprises polyimide, and a material of the third substrate layer comprises silicon oxide or silicon nitride.

14. The display panel according to claim 1, wherein the base substrate further comprises a fourth substrate layer located at one side of the second substrate layer away from the third substrate layer, and a material of the fourth substrate layer comprises polyimide.

15. A manufacturing method of the display panel according to claim 3, comprising:
forming the first substrate layer;
forming the third substrate layer on the first substrate layer;
forming a second substrate material layer on one side of the third substrate layer away from the first substrate layer; and
patterning the second substrate material layer located in the transparent display region by using a mask plate to form the first pattern,
wherein the mask plate is a mask plate for forming the second electrode in the transparent display region.

16. A display device, comprising:
the display panel according to claim 1; and
a functional component, located in the transparent display region and at a side opposite to a light emitting side of the display panel, the functional component being configured to emit or receive light passing through the transparent display region.

17. A display panel, comprising:
a base substrate comprising a display region and a peripheral region surrounding the display region, the base substrate comprising a first substrate layer, a third substrate layer and a second substrate layer which are sequentially stacked, a material of the second substrate layer comprising amorphous silicon,
wherein a thickness of the second substrate layer at each position in the display region and the peripheral region is even and not more than 10 nanometers;
the display panel further comprising: a plurality of pixel units located in the display region of the base substrate,
wherein the display region comprises a first pixel density region and a second pixel density region, a pixel density of the plurality of pixel units located in the first pixel density region is greater than a pixel density of the plurality of pixel units located in the second pixel density region;
each of the plurality of pixel units includes an organic light emitting layer, a first electrode and a second electrode which are located at both sides of the organic light emitting layer, the display panel includes a thin film transistor, and the thin film transistor is electrically connected with the second electrode, and the second substrate layer is located at a side of the second electrode away from the organic light emitting layer.

18. The display panel according to claim 17, wherein the thickness of the second substrate layer is in a range from 1 nanometer to 3 nanometers.

19. A display panel, comprising:
a base substrate comprising a display region and a peripheral region surrounding the display region, the base substrate comprising a first substrate layer, a third substrate layer and a second substrate layer which are sequentially stacked, a material of the second substrate layer comprising amorphous silicon,
wherein the display region comprises a transparent display region, the transparent display region comprises a pixel region and a light transmission region, and a thickness of the second substrate layer located in the light transmission region is less than a thickness of at least part of the second substrate layer located outside the transparent display region;
a thickness of the second substrate layer located at each position in the display region is even, and a thickness of the second substrate layer located in the peripheral region is greater than a thickness of the second substrate layer located in the display region.

* * * * *